United States Patent
Wang et al.

(10) Patent No.: US 7,355,235 B2
(45) Date of Patent: Apr. 8, 2008

(54) SEMICONDUCTOR DEVICE AND METHOD FOR HIGH-K GATE DIELECTRICS

(75) Inventors: Chih-Hao Wang, Hsin-Chu (TW); Ching-Wei Tsai, Taoyuan (TW); Shang-Chih Chen, Jiadong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 293 days.

(21) Appl. No.: 11/020,377

(22) Filed: Dec. 22, 2004

(65) Prior Publication Data

US 2006/0131675 A1    Jun. 22, 2006

(51) Int. Cl.
*H01L 27/108*    (2006.01)
(52) U.S. Cl. ..................................... 257/310
(58) Field of Classification Search ........... 257/310
See application file for complete search history.

(56) References Cited

U.S. PATENT DOCUMENTS

| | | | |
|---|---|---|---|
| 6,063,698 A | 5/2000 | Tseng et al. | |
| 6,136,654 A | 10/2000 | Kraft et al. | |
| 6,174,775 B1 | 1/2001 | Liaw | |
| 6,297,103 B1 | 10/2001 | Ahn et al. | |
| 6,479,403 B1 | 11/2002 | Tsei et al. | |
| 6,566,205 B1 | 5/2003 | Yu et al. | |
| 6,596,599 B1 | 7/2003 | Guo | |
| 6,614,067 B2 | 9/2003 | Liaw | |
| 6,632,714 B2 | 10/2003 | Yoshikawa | |
| 6,706,581 B1 | 3/2004 | Hou et al. | |
| 6,716,695 B1 | 4/2004 | Hattangady et al. | |
| 6,720,221 B1 | 4/2004 | Ahn et al. | |
| 6,746,900 B1 | 6/2004 | Liu et al. | |
| 2002/0195643 A1* | 12/2002 | Harada | 257/310 |
| 2004/0026687 A1 | 2/2004 | Grupp et al. | |
| 2004/0142524 A1 | 7/2004 | Grupp et al. | |
| 2004/0164318 A1 | 8/2004 | Lee et al. | |

OTHER PUBLICATIONS

Sekine, K., et al., "Nitrogen Profile Control by Plasma Nitridation Technique for Poly-Si Gate HfSiON CMOSFET with Excellent Interface Property and Ultra-low Leakage Current," IEDM (2003) pp. 103-106.

(Continued)

*Primary Examiner*—Kiesha L Rose
(74) *Attorney, Agent, or Firm*—Slater & Matsil, L.L.P.

(57) ABSTRACT

A semiconductor device and process including a high-k gate dielectric is described. A substrate is provided, and a high-k gate dielectric material, preferably amorphous HfSiON, is deposited over the substrate. In preferred embodiments, the high-k dielectric material includes nitrogen. In a preferred embodiment, a silicon nitride layer is deposited using jet vapor deposition (JVD) on the high-k dielectric material. When the JVD nitride layer is deposited according to preferred embodiments, the layer has a low density of charge traps, it maintains comparable carrier mobility and provides better EOT compared to oxide or oxynitride. A second nitrogen-containing layer formed between the high-k dielectric and the gate electrode acts as a diffusion barrier. It also reduces problems relating to oxygen vacancy formation in high-k dielectric and therefore minimizes Fermi-level pinning.

26 Claims, 2 Drawing Sheets

OTHER PUBLICATIONS

Iwamoto, T., et al., "A Highly Manufacturable Low Power and High Speed HfSiO CMOS FET with Dual Poly-Si Gate Electrodes," IEEE (2003) 4 pages.

Shi, Z., et al., "Mobility Enhancement in Surface Channel SiGe PMOSFETs with $HfO_2$ Gate Dielectrics," IEEE Electron Device Letters, vol. 24, No. 1 (Jan. 2003) pp. 34-36.

Wang, Howard C.-H., et al., "Low Power Device Technology with SiGe Channel, HfSiON, and Poly-Si Gate," International Electron Devices Meeting (2004) 3 pages.

Tamura, Y., et al., "SiN-Capped HfSiON Gate Stacks with Improved Bias Temperature Instabilities for 65 nm-node Low-Standby-Power Transistors," Symposium on VLSI Technology Digest of Technical Papers (2004) pp. 210-211.

Hu, C., "Device Challenges and Opportunities," Symposium on VLSI Technology Digest of Technical Papers (2004) pp. 4-5.

Fung, Samuel K.H., et al., "65nm CMOS High Speed, General Purpose and Low Power Transistor Technology for High Volume Foundry Application," Symposium on VLSI Technology Digest of Technical Papers (2004) pp. 92-93.

Yang, C.W., et al., "Effect of Polycrystalline-silicon Gate Types on the Opposite Flatband Voltage Shift in $N$-Type and $P$-type Metal-Oxide-Semiconductor Field-Effect Transistors for High-$k$-$HfO_2$ Dielectric," Applied Physics Letters, vol. 83, No. 2 (Jul. 14, 2003) pp. 308-310.

Diaz, C.H., "Bulk CMOS Technology for SOC," Extended Abstracts of International Workshop on Junction Technology, Japan Society of Applied Physics (2002) pp. 91-96.

Ma, T.P., "Making Silicon Nitride Film a Viable Gate Dielectric," IEEE Transactions on Electron Devices, vol. 45, No. 3 (Mar. 1998) pp. 680-690.

Shiraishi, K., et al., "Physics in Fermi Level Pinning at the PolySi/Hf-based High-k Oxide Interface," Symposium on VLSI Technology Digest of Technical Papers (2004) pp. 108-109.

Cartier, E., et al., "Systematic Study of pFET $V_t$ with Hf-based gate stacks with poly-Si and FUSI gates," Symposium on VLSI Technology Digest of Technical Papers (2004) pp. 44-45.

Shima, M., "<100> Strained-SiGe-Channel p-MOSFET with Enhanced Hole Mobility and Lower Parasitic Resistance," FUJITSU Sci. Tech. J., vol. 39, No. 1, (Jun. 2003) pp. 78-83.

Reed, J., et al., "Properties of $Si_3N_4/Si_xGe_{1-x}$ Metal-Insulator-Semiconductor Capacitors," Electronics Letters, vol. 27, No. 20 (Sep. 26, 1991) pp. 1826-1827.

Yeo, Y-C., et al., "Enhanced Performance in Sub-100 nm CMOSFETs Using Strained Epitaxial Silicon-Germanium," IEDM (2000) pp. 753-756.

Lu, W., et al., "p-Type SiGe Transistors with Low Gate Leakage Using SiN Gate Dielectric," IEEE Electron Device Letters, vol. 20, No. 10 (Oct. 1999) pp. 514-516.

She, M., et al., "JVD Silicon Nitride as Tunnel Dielectric in p-Channel Flash Memory," IEEE Electron Device Letters, vol. 23, No. 2 (Feb. 2002) pp. 91-93.

Khare, M., et al., "Highly Robust Ultra-Thin Gate Dielectric for Giga Scale Technology," Symposium on VLSI Technology Digest of Technical Papers (1998) pp. 218-219.

Wang, D., et al., "High-Quality MNS Capacitors Prepared by Jet Vapor Deposition at Room Temperature," IEEE Electron Device Letters, vol. 13, No. 9 (Sep. 1992) pp. 482-484.

Weber, O., et al., "55nm High Mobility SiGe(:C) pMOSFETs with $HfO_2$ Gate Dielectric and TiN Metal Gate for Advanced CMOS," Symposium on VLSI Technology Digest of Technical Papers (2004) pp. 42-43.

Tseng, H.-H., et al., "Ultra-Thin Decoupled Plasma Nitridation (DPN) Oxynitride Gate Dielectric for 80-nm Advanced Technology," IEEE Electron Device Letters, vol. 23, No. 12 (Dec. 2002) pp. 704-706.

Tseng, H.-H., et al., "Threshold Voltage Instability and Plasma Induced Damage of PolySi/HfO2 Devices—Positive Impact of Deuterium Incorporation," IEEE International Conference on Integrated Circuit Design and Technology (2004) pp. 255-259.

\* cited by examiner

SEMICONDUCTOR DEVICE AND METHOD FOR HIGH-K GATE DIELECTRICS

TECHNICAL FIELD

This invention relates generally to the fabrication of semiconductor devices, and more particularly to devices that include high-k gate dielectrics.

BACKGROUND

As metal oxide semiconductor field effect transistor (MOSFET) feature sizes decrease, the gate oxide thickness of the devices also decreases. This decrease is driven in part by the demands of overall device scaling. As gate conductor widths decrease, for example, other device dimensions decrease to maintain the proper device scale, and thus device operation. Another factor driving reduction of the gate oxide thickness is the increased transistor drain current realized from a reduced gate dielectric thickness. The transistor drain current is proportional to the amount of charge induced in the transistor channel region by the voltage applied to the gate conductor. The amount of charge induced by a given voltage drop across the gate dielectric (e.g., the gate oxide) is a factor of the capacitance of the gate dielectric.

In order to achieve increased capacitance, gate oxide thicknesses have been decreased to as thin as 10 Å. These extremely thin gate oxides result in increased gate-to-channel leakage current, however. Problems such as this have led to the use of materials that have dielectric constants that are greater than the dielectric constant of silicon oxide, which has a k value of about 3.9. Higher k values, for example 20 or more, may be obtained with various transition metal oxides. These high-k materials allow high capacitances to be achieved with relatively thick dielectric layers. In this manner, the reliability problems associated with very thin dielectric layers can be avoided while improving transistor performance.

There are, however, fabrication problems associated with forming gate dielectric layers that include high-k materials, particularly when a metal gate is employed. For example, high dielectric materials may contain a greater number of bulk traps and interface traps than gate dielectrics made from thermally grown $SiO_2$. Traps adversely affect both subthreshold slope and threshold voltage ($V_t$). High trap density also leads to leakage through Frenkel-Poole tunneling, and it causes bias temperature instability.

One class of high-k dielectrics that have received much attention recently is hafnium-based oxides. Unlike $SiO_2$, wherein chemical bonding is predominately covalent, Hf-based oxides are predominately ionic and therefore exhibit their own host of problems. Control of flatband voltage ($V_{fb}$) has proven particularly difficult. Recent work has suggested that oxygen vacancy formation in the Hf dielectric and/or interfacial Hf reactions may account for the large observed $V_{fb}$, shifts, particularly in the case of p+ gates.

Therefore, there is a need for passivating materials, structures, and methods in the manufacture of semiconductor devices that use high-k dielectrics.

SUMMARY OF THE INVENTION

These and other problems are generally solved or circumvented, and technical advantages are generally achieved by preferred embodiments of the present invention that provide a novel process and structure for semiconductor devices using high-k gate dielectric materials.

A preferred embodiment of the invention comprises a substrate; a nitrogen-containing layer over the substrate, wherein the silicon nitride layer is deposited using jet vapor deposition (JVD); a high-k dielectric material comprising nitrogen over the nitrogen-containing layer; and a gate electrode material over the high-k dielectric material.

In a preferred embodiment, a channel material of, for example, strained silicon (Si) or strained silicon germanium (SiGe) is deposited beneath the JVD nitrogen-containing layer to provide a surface channel for the resulting devices and to increase the carrier mobility.

In another preferred embodiment, the high-k dielectric has a dielectric constant k greater than about 7, and may include amorphous HfSiON. Nitrides and high-k dielectric stacks may be used as the dielectric including Hf, Si, O and N. Tantalum (Ta) or lanthanum (La) oxides, aluminum oxide and/or nitrides, combination or stacked dielectrics and other known high-k dielectrics may be used.

In another preferred embodiment, the devices may be fabricated over an insulator in a silicon-on-insulator (SOI) structure. The substrate material may be bulk silicon and may include n and p type doped well areas, alternatively the substrate may comprise SiGe, Ge, strained Si, strained Ge or a combination or stacked arrangement of Si/SiGe layers.

In another preferred embodiment, a metal gate electrode or a combination material including a metal may be used for the gate electrode, for example a TiN (Titanium Nitride) metal gate electrode may be used. Polysilicon, and doped polysilicon, may be used for the gate electrode, the polysilicon gate electrodes may also incorporate an additional salicide coating for better performance.

Additional features and advantages of embodiments of the invention will be described hereinafter, which form the subject of the claims of the invention. It should be appreciated by those skilled in the art that the specific embodiments disclosed might be readily utilized as a basis for modifying or designing other structures or processes for carrying out the purposes of the present invention. It should also be realized by those skilled in the art that such equivalent constructions and variations on the example embodiments described do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in coonjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The operation and fabrication of the presently preferred embodiments are discussed in detail below. However, the embodiments and examples described herein are not the only applications or uses contemplated for the invention. The specific embodiments discussed are merely illustrative of specific ways to make and use the invention, and do not limit the scope of the invention or the appended claims.

Figure 1:
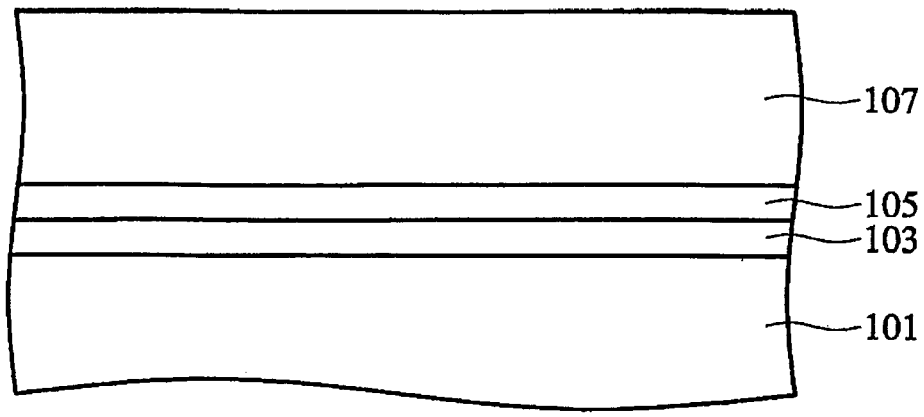
FIG. 1 is a cross-sectional view of an embodiment of the present invention comprising a nitrogen-containing layer on a substrate.

FIG. 1 depicts a cross sectional view of an integrated circuit at an intermediate fabrication stage. It is not drawn to scale, but drawn as an illustration only. A semiconductor substrate 101 is preferably a silicon wafer, however, the substrate 101 may alternatively comprise Ge, SiGe, strained silicon, strained germanium, GaAs, silicon on insulator (SOI), germanium on insulator (GOI), a combination, or a stacked arrangement of layers such as Si/SiGe.

Preferably, a first nitrogen-containing layer 103 is deposited using conventional jet vapor deposition (JVD). In preferred embodiments, the first nitrogen-containing layer thickness is less than about 30 Å and more preferably between about 5 and 15 Å. The JVD process utilizes a high-speed jet of a light carrier gas to transport the depositing species onto the substrate to form the desired film.

The JVD process includes using jets in a low vacuum. For the deposition of silicon nitride, one may use a conventional coaxial dual nozzle jet vapor source. Highly diluted silane, $SiH_4$, from the inner nozzle and $N_2$ and He from the outer nozzle flow into a plasma discharge region sustained by a microwave cavity. The highly diluted silane concentration is preferably about 10 ppm in He and $N_2$ carrier gases. The deposition rate and film composition is adjusted by changing the silane concentration and/or the $SiH_4$/He and $SiH_4/N_2$ flow ratios.

In preferred embodiments, the first nitrogen-containing layer 103 comprises essentially stoichiometric silicon nitride ($Si_3N_4$). Stoichiometric silicon nitride exhibits better electrical performance than other, non-stoichiometric, nitrides ($Si_xN_y$). Less preferred compositions result in dangle bonds, thus increasing the amount of traps. In general, a low-trap nitride prevents trap-assisted carrier transport, and minimizes interaction between the substrate 101 and a high-k dielectric 105.

The gaseous plasma is sustained only in the outer nozzle, as the pressure in the small inner nozzle is maintained sufficiently high, preferably about 600 Torr, to suppress plasma formation and premature silane dissociation. The pressure in the outer nozzle is preferably about 2 Torr. Energetic nitrogen species (including atomic nitrogen) generated in the plasma and silane molecules are both carried by the sonic He jet toward the substrate where they form silicon nitride. Because of the high kinetic energy of the impinging depositing species, intentional substrate heating is not necessary, thereby allowing for room temperature deposition.

Better than 5% film uniformity across a large area can be achieved by scanning the substrate relative to the jet source. The deposition rate and film composition are controlled by the silane, helium, and nitrogen partial pressures as well as their flow rates. Under the conditions described herein, deposition rates of about 15 Å/min are achieved.

Details of a conventional JVD process are described in a paper by T. P. Ma, IEEE Trans. Elec. Devices, Vol. 45(3) p. 680 (1998), which is hereby incorporated by reference in its entirety.

The first nitrogen-containing layer 103 exhibits a sufficiently low interface state density to avoid problems such as increased leakage current and degraded carrier channel mobility, which are commonly encountered in conventional processing. JVD silicon nitride has predominantly S—N bonds, with small amounts of Si—H and N—H bonds. The hydrogen concentrations were lower than those in typical CVD nitrides, which may be partly responsible for JVD nitride's improved electrical properties. JVD-deposited nitride layers typically have an interface state density less than about $5*10^{11}$ c/cm$^2$. The density can be obtained by carrying out charge-pumping (C-P) measurement.

As described above, high-k dielectrics such as HfSiON suffer from bulk traps and interface traps. As known in the art, bulk trap problems are avoided by using amorphous HfSiON. Interfacial traps are isolated from a Si substrate by inserting an IL (interfacial layer), such as the first nitrogen-containing layer 103, between the substrate 101 and the high-k dielectric 105. To keep the electrically effective dielectric thickness thin enough, JVD nitride instead of oxide is used. This is because conventional CVD or PVD nitride still suffers from worse bulk traps and interface traps. Low-trap nitride, non-stoichiometric silicon nitride, or more preferably essentially stoichiometric silicon nitride, advantageously provide a higher dielectric constant than oxide and similar trap density with oxide.

A further advantage of preferred embodiments is that JVD lends itself to deposition of homogeneous layers as described above. Therefore, embodiments avoid problems associated with spatial variation in device performance. This makes JVD nitridation suitable for next generation device scaling requirements.

In a preferred embodiment of the invention illustrated in FIG. 1, the high-k gate dielectric 105 is deposited directly onto the first nitrogen-containing layer 103.

Deposition of the high-k dielectric material 105 may be performed by conventional methods including remote plasma CVD (RPCVD), plasma enhanced CVD (PECVD), atomic layer deposition (ALD), MOCVD, PVD, sputtering or other methods known in the art. High-k dielectrics are those dielectrics that have a dielectric constant k of greater than silicon dioxide, about 3.9. Possible high-k dielectrics include $Ta_2O_5$, $TiO_2$, $Al_2O_3$, $ZrO_2$, $HfO_2$, $Y_2O_3$, $L_2O_3$, and their aluminates and silicates. The high k dielectric material may comprise a single layer of one metal oxide or several layers including two or more metal oxides. Still other possible high-k dielectrics include silicon nitride, hafnium silicon oxynitride, lanthanum oxides, and other high-k dielectric materials known in the art. A range of dielectric constant materials is known, for example for the range of $3.9 < k < 9$, the high-k gate dielectric may include oxy-nitride, oxygen containing dielectrics, nitrogen-containing dielectrics, combinations of these and multiple layers of these. For $k > 9.0$, the dielectrics may include any of $HfO_2$, $HfSiO_x$, $HfAlO_x$, zirconium such as $ZrO_2$, aluminum such as $Al_2O_3$, titanium such as $TiO_2$, tantalum pentoxide, lanthanum oxide such as $La_2O_3$, barium strontium compounds such as BST, lead based compounds such as $PbTiO_3$, similar compounds such as $BaTiO_3$, $SrTiO_3$, $PbZrO_3$, PST, PZN, PZT, PMN, metal oxides, metal silicates, metal nitrides, combinations and multiple layers of these. The dielectric 105 may further include Si, Ge, F, C, B, O, Al, Ti, Ta, La, Ce, Bi, W, or Zr for example. The high-k dielectric layer 105 is typically 1 to 100 Angstroms, preferably less than about 50 Å.

In preferred embodiments, the high-k dielectric 105 includes ALD-deposited, amorphous HfSiON. In one example a high-k dielectric layer of HfSiON was deposited to about 40 Angstroms thickness and having an equivalent oxide thickness (EOT) of less than about 2.0 nanometers.

As deposited, high-k layers typically have a high density of traps. These traps may be passivated by impregnating the layer with nitrogen. Suitably passivated embodiments result in a trapped charge density less than about $10^{11}$ to $10^{12}$ cm$^{-2}$, thereby lowering leakage current, lowering EOT and improving dielectric reliability. However, conventional nitrogen passivation suffers from penetration of nitrogen into the substrate 101, thereby degrading NBTI (Negative Bias Temperature Instability) reliability. Preferred embodiments advantageously avoid this problem. Embodiments include methods for introducing nitrogen such as diffusion from a gas source, remote plasma nitridation, and decoupled plasma nitridation.

One embodiment comprising a method for impregnating the dielectric layer with nitrogen includes heating for about 0.5 to 2 minutes at about 600 to 800° C., preferably in ammonia, nitrous oxide, and nitric oxide, or a combination thereof.

Another embodiment includes remote plasma nitridation for about 0.5 to 4 minutes at about 400 to 1,000° C., preferably in ammonia, nitrogen, nitrous oxide, and nitric oxide, or a combination thereof. A preferred method of performing remote plasma nitridation is at about 550° C. for about 1 minute in nitrogen.

Yet another embodiment for passivating traps in high-k layers includes using decoupled plasma nitridation for about 0.1 to 2 minutes at about 25 to 100° C., preferably in ammonia, nitrogen, nitrous oxide, and nitric oxide, or a combination thereof. A preferred method of performing decoupled plasma nitridation is at about 25° C. (or at room temperature) for about 30 seconds in nitrogen.

Applicants find that the first nitrogen-containing layer 103 between the substrate 101 and the high-k dielectric 105 advantageously prevent additional nitrogen incorporation into the substrate 101 during nitrogen passivation, thereby avoiding NBTI reliability problems. In preferred embodiments, the concentration of nitrogen in the first nitrogen-containing layer 103 is greater than the nitrogen concentration in the high-k dielectric 105. The first nitrogen-containing layer 103 is preferably an essentially stoichiometric silicon nitride formed using JVD.

FIG. 1 further depicts the gate electrode material 107 over the high-k dielectric 105. The gate electrode material 107 may include polysilicon, doped polysilicon, metal compositions such as titanium nitride (TiN), silicides, or other metal gate electrode materials used in the art.

In a preferred embodiment the gate electrode material 107 is a doped polysilicon gate electrode material. The electrode may be deposited by a conventional CVD process to a thickness less than about 1500 Angstroms. In preferred embodiments the gate electrode includes a dopant of a first conductivity type, while the device source and drain regions include a dopant having a second conductivity type, as described below.

For example, for a PMOS, the PMOS gate electrode is preferably n+ doped, while for a NMOS, the NMOS gate electrode is preferably p+ doped. The n+ poly-Si gate is preferably doped with a 10 KeV, $1\times10^{15}$ cm$^{-2}$ implant dose of phosphorus. The p+ poly-Si gate is preferably doped with a 5 KeV, $3.5\times10^{15}$ cm$^{-2}$ implant dose of boron. A spike activation anneal is done at approximately at 1050° C.

Figure 2:
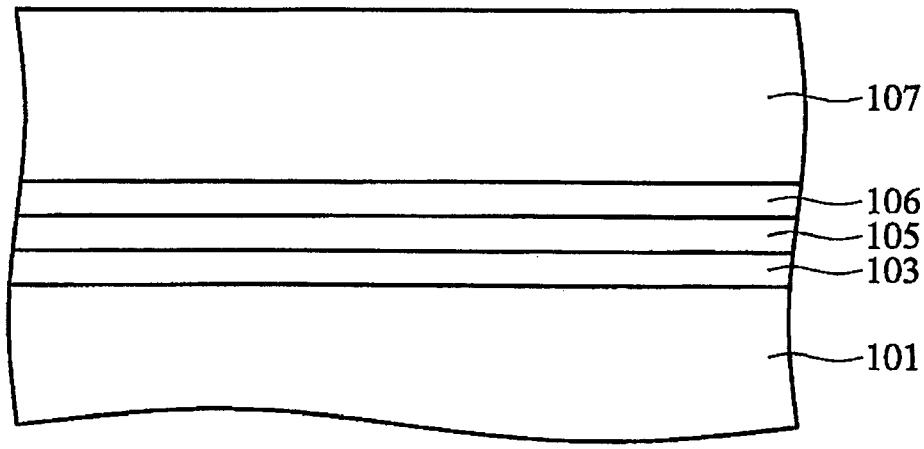
FIG. 2 is a cross-sectional view of an embodiment of the present invention comprising multiple nitrogen-containing layers.

FIG. 2 illustrates another preferred embodiment wherein a second nitrogen-containing layer 106, preferably a JVD nitride layer, is interposed between the gate electrode material 107 and the high-k dielectric 105. An advantage of preferred embodiments is that the second nitrogen-containing layer 106 acts as a diffusion barrier. Therefore, the second nitrogen-containing layer 106 advantageously prevents dopant and impurity diffusion and oxygen migration across interfacial boundaries. For example in FIG. 2, the second nitrogen-containing layer 106 prevents diffusion between the gate electrode material 107 and the high-k dielectric 105.

Without the second nitrogen-containing layer 106, TEM analysis indicates that a reaction layer greater than about 0.5 nm thick (not shown) results from the reaction between the high-k dielectric 105 and the gate electrode 107. Without the second nitrogen-containing layer 106, the reaction layer induces Fermi-pinning at the interface between high-k dielectric 105 and gate electrode 107 (were the second nitrogen-containing layer 106 not present). With the second nitrogen-containing layer 106, the reaction layer is preferably reduced below about 0.5 nm.

Some of the advantages of the preferred embodiment in FIG. 2 are summarized as follows. The first nitrogen-containing layer 103 advantageously keeps EOT low, and it also maintains good interfacial quality between the substrate 101 and the first nitrogen-containing layer 103. The second nitrogen-containing layer 106 advantageously serves as a diffusion barrier for oxygen vacancies, and it prevents interaction (e.g. Fermi-pining) between the high-k dielectric 105 and the gate electrode 107.

By way of further illustration, the embodiment in FIG. 2 may comprise a boron-doped, p+ poly gate 107 on a JVD nitride layer 106. The second nitrogen-containing layer 106 is deposited on amorphous HfSiON 105, the amorphous HfSiON 105 being deposited on JVD nitride layer 103. In this illustration, the substrate 101 is preferably n-type since there is a p+ poly gate, 107. The embodiment in FIG. 2, therefore, advantageously prevents boron and phosphorous diffusion from their respective regions resulting in enhanced device performance.

Still referring to FIG. 2, in an alternative embodiment, the second nitrogen-containing layer 106 includes a JVD nitride layer, while the first nitrogen-containing layer 103, may comprise an interfacial layer such as an oxide, or a nitride, SiON, or SiO$_2$.

In alternative preferred embodiments, both the gate electrode and the associated or corresponding source and drain may be of the same conductivity type, but with different or equal doping levels. Electrodes may be conventionally doped in situ with conventional dopants. Preferred n-type dopants, include antimony, phosphorous or arsenic, for example. Examples of preferred p-type dopants include boron, aluminum, gallium, or indium.

Figure 3:
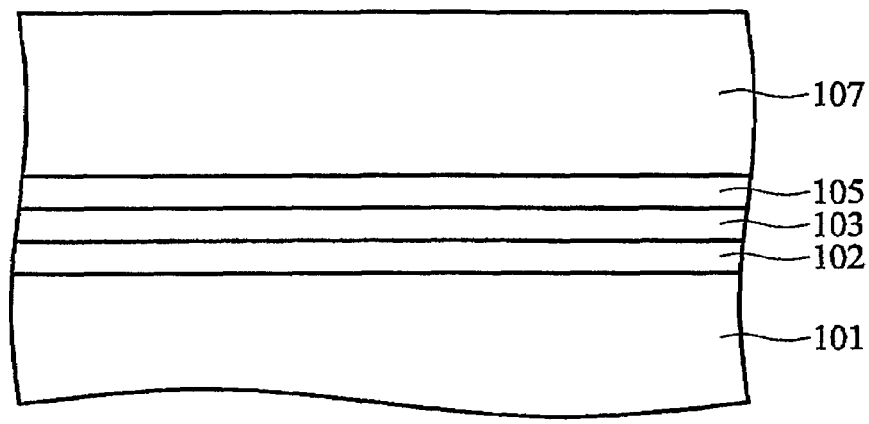
FIG. 3 is a cross-sectional view of an embodiment of the present invention comprising a nitrogen-containing layer on an extrinsic surface layer.

The exemplary embodiments described herein do not preclude using additional materials and methods to increase performance. For example, a strained channel material such as SiGe is known in the art to increase the mobility of the carriers, which is particularly important in the production of P type MOS transistors. Such an embodiment is illustrated in FIG. 3, wherein a strained channel material, 102, preferably SiGe, is epitaxially grown on the substrate 101. The strained channel material 102 is deposited, for example, by epitaxial growth. It is preferably less than about 200 Angstroms, and in preferred embodiments, it is about 100 Angstroms. The strained material may be any of several semiconductor materials, compound or multilayer materials may be used, including non-doped SiGe, SiC, or Ge.

In conventional MOS devices having strained channels, a Si cap layer is necessary to avoid interference from surface roughness and interface scattering. Since the cap layer results in a buried channel, such a configuration has severe short channel effects. In the preferred embodiment of FIG.

3, however, the first nitrogen-containing layer 103 eliminates the need for a cap layer, thereby reducing short channel effects. A high-k dielectric 105, preferably amorphous HfSiON, and a gate electrode material 107 further comprise the surface channel embodiment in FIG. 3.

Figure 4:
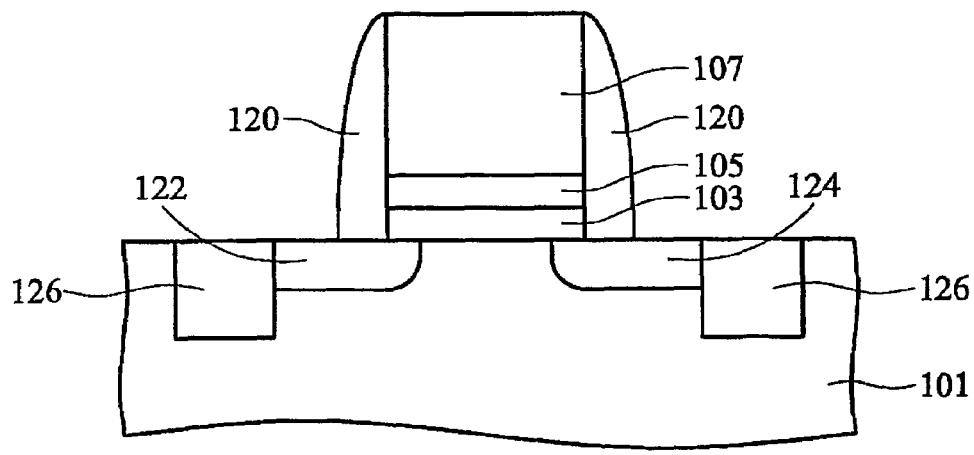
FIG. 4 is a cross-sectional view of a MOSFET manufactured according to preferred embodiments of the present invention.

Conventional processing, known in the art, is followed to complete the construction of the MOSFET, FIG. 4. FIG. 4 depicts the substrate 101, in accordance with a preferred embodiment of the present invention after sidewall spacers 120 are deposited and patterned on either side of the gate electrode 107, the gate dielectric 105, and the first nitrogen-containing layer 103. The sidewall spacers 120 are deposited using a non-high-k dielectric to provide a protective spacer over the sidewalls of the electrode. The sidewall spacers 120 are preferably a nitrogen-containing oxide, silicon nitride, oxide or a stacked combination thereof. The sidewall spacers 120 may be deposited by low temperature deposition techniques including PECVD and remote plasma CVD (RPCVD). The sidewall spacers 120 may comprise silicon nitride or silicon oxynitrides. In a preferred embodiment the oxide or nitride sidewall spacer may be about 40 Angstroms wide. In an example, the sidewall spacers 120 are $SiO_xN_y$, nitride or a stacked combination thereof.

As further depicted in FIG. 4, source and drain diffusions 122 and 124 are formed in the substrate areas using ion implantation and thermal anneal procedures as are known in the conventional art. Gate electrode 107, first nitrogen-containing layer 103, and the source 122 and drain 124 diffusions form a planar MOS transistor. Alternatively, the source and drain regions 122, 124 may be formed epitaxially, for example, LPE.

Depending on the type of dopants used in the source, drain, and the substrate, the transistors may be of a P type MOS transistor or an N type MOS transistor. In a complementary MOS transistor integrated circuit, the transistors may be formed in well diffusions (not shown) that were performed prior to forming the STI region 126, as is known in the art, the wells being isolated by the STI regions 126.

To summarize, a preferred embodiment discloses a method for fabricating a MOSFET. The method comprises providing a substrate; forming a shallow trench isolation region into the substrate; depositing a nitrogen-containing layer over the substrate, the layer of silicon nitride having sidewalls inside the shallow trench isolation region. The method further comprises depositing over the layer of silicon nitride, a high-k gate dielectric material having nitrogen, the high-k gate dielectric having sidewalls coextensive with the silicon nitride sidewalls. The method still further comprises depositing a gate electrode material including a dopant of a first conductivity type over the high-k gate dielectric material, the gate electrode having sidewalls coextensive with the dielectric sidewalls and the silicon nitride sidewalls; depositing sidewall spacers on the gate electrode sidewalls, on the dielectric sidewalls, and on the silicon nitride sidewalls; and forming a source and drain region including a dopant of a second conductivity type opposite to the first conductivity type, the source region adjacent one sidewall insulator and the drain region adjacent an opposite sidewall spacer.

In further accordance with conventional processing, known in the art, for example, a silicide may be formed by depositing a metal such as titanium, cobalt, or nickel and then treating it to form self-aligned silicide, or salicide, on top of the gate electrode, the source and drain regions and other areas to provide a lower resistance and improve device performance. Following the salicide step, if used, interlevel insulation layers are formed above the substrate using deposition steps to deposit oxide, nitride or other conventional insulation layers, typically silicon dioxide is formed. Contact areas are patterned and etched into the insulators to expose the source, drain and gate electrodes, the resulting vias are filled with conductive material to provide electrical connectivity from metallization layers above the interlevel insulating layers down to the gate electrodes, the source region and the drain region. Metallization layers of aluminum, or copper, may be formed over the interlevel insulation layers using known techniques such as an aluminum metallization process or a dual damascene copper metallization process to provide one, or several, wiring layers that may contact the vias and make electrical connections to the gate electrodes, and the source and drain regions. Conventional clean up, passivation, die saw, packaging, assembly and test steps are used to complete the integrated circuit devices formed on the substrate.

The embodiments of the invention described above are exemplary and not limiting, and variations that are apparent to those skilled in the art that include the features of the invention are within the scope of the invention and the appended claims.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
   a substrate;
   a nitrogen-containing, substantially metal-free layer over the substrate;
   a high-k dielectric material having nitrogen over the nitrogen-containing layer; wherein the nitrogen percentage in the high-k dielectric material is lower than that in the nitrogen-containing layer; and
   a gate electrode material over the high-k dielectric material.

2. The semiconductor device of claim 1, wherein the nitrogen-containing layer is low-trap nitride.

3. The semiconductor device of claim 2, wherein the low-trap nitride is jet vapor deposited (JVD) silicon nitride.

4. The semiconductor device of claim 2, wherein the low-trap nitride has an interface state density less than about $5*10^{11}$ c/cm$^2$.

5. The semiconductor device of claim 1, wherein the nitrogen-containing layer is less than about 3 nm thick.

6. The semiconductor device of claim 1, wherein the high-k gate dielectric further comprises a material selected from the group consisting essentially of HFSiON, amorphous HfSiON, $Ta_2O_5$, $TiO_2$, $Al_2O_3$, $ZrO_2$, $HfO_2$, $Y_2O_3$, $La_2O_3$, aluminates, silicates, $HfO_2$, $HfSiO_x$, $HfAlO_x$, $Al_2O_3$, $TiO_2$, $PbTiO_3$, $BaTiO_3$, $SrTiO_3$, and $PbZrO_3$, and combinations thereof.

7. The semiconductor device of claim 1, wherein the substrate comprises Si, strained Si, Ge, strained Ge, SiC, strained SiGe, SOI, GOI, GaAs, a stacked arrangement of layers, or a combination thereof.

8. The semiconductor device of claim 1, wherein the gate electrode material is selected from the group consisting essentially of silicon, germanium, metal silicide, metal, and combinations thereof.

9. The semiconductor device of claim 1, further comprising a second nitrogen-containing layer over the high-k dielectric layer.

10. The semiconductor device of claim 9, wherein the second nitrogen-containing layer comprises JVD silicon nitride.

11. A semiconductor device, comprising:
    a substrate;
    a nitrogen-containing layer over the substrate, wherein the nitrogen-containing layer is substantially void of metal and is deposited using jet vapor deposition (JVD);
    a high-k dielectric material having nitrogen over the nitrogen-containing layer wherein the high-k dielectric layer has a lower percentage of nitrogen than does the nitrogen-containing layer; and
    a gate electrode material over the high-k dielectric material.

12. The semiconductor device of claim 11, wherein the nitrogen-containing layer is low-trap nitride.

13. The semiconductor device of claim 12, wherein the low-trap nitride has an interface state density less than about $5*10^{11}$ c/cm$^2$.

14. The semiconductor device of claim 11, wherein the nitrogen-containing layer is less than about 3 nm thick.

15. The semiconductor device of claim 11, wherein the substrate comprises Si, strained Si, Ge, strained Ge, SiC, strained SiGe, SOI, GOI, GaAs, a stacked arrangement of layers, or a combination thereof.

16. The semiconductor device of claim 11, further comprising a second nitrogen-containing layer over the high-k dielectric layer.

17. The semiconductor device of claim 16, wherein the second nitrogen-containing layer comprises JVD silicon nitride.

18. A semiconductor device, comprising:
    a substrate;
    a non-metal, nitrogen-containing interfacial layer over the substrate;
    a high-k dielectric material having nitrogen over the interfacial layer wherein the nitrogen content in the high-k dielectric material is lower than the nitrogen content in the interfacial layer;
    a nitrogen-containing layer on the high-k dielectric material; and
    a gate electrode material over the nitrogen-containing layer.

19. The semiconductor device of claim 18, wherein the nitrogen-containing layer is low-trap nitride.

20. The semiconductor device of claim 19, wherein the low-trap nitride is deposited using jet vapor deposition (JVD).

21. The semiconductor device of claim 19, wherein the low-trap nitride has an interface state density less than about $5*10^{11}$ c/cm$^2$.

22. The semiconductor device of claim 18, wherein the reaction layer is less than about 0.5 nm.

23. The semiconductor device of claim 18, wherein the high-k dielectric material is less than about 5 nm thick.

24. The semiconductor device of claim 18, wherein the high-k dielectric material further comprises any material from the group consisting essentially of HfSiON, amorphous HfSiON, $Ta_2O_5$, $TiO_2$, $Al_2O_3$, $ZrO_2$, $HfO_2$, $Y_2O_3$, $La_2O_3$, aluminates, silicates, $HfO_2$, $HfSiO_x$, $HfAlO_x$, $Al_2O_3$, $TiO_2$, $PbTiO_3$, $BaTiO_3$, $SrTiO_3$, and $PbZrO_3$, or combinations thereof.

25. The semiconductor device of claim 18, wherein the substrate comprises Si, strained Si, Ge, strained Ge, SiC, strained SiGe, SOI, GOI, GaAs, a stacked arrangement of layers, or a combination thereof.

26. The semiconductor device of claim 18, wherein the interfacial layer consists essentially of approximately stoichiometric silicon nitrite, non-stoichiometric silicon nitride, and combinations thereof.

* * * * *